US012803243B2

(12) United States Patent
Hu et al.

(10) Patent No.: US 12,803,243 B2
(45) Date of Patent: Nov. 17, 2026

(54) VOLTAGE-ADAPTIVE LASER DRIVING CIRCUIT AND CONTROL METHOD THEREOF

(71) Applicants: Casi Vision Technology (Luoyang) Co., Ltd., Luoyang (CN); Casi Vision Technology (Beijing) Co., Ltd., Beijing (CN)

(72) Inventors: Xiaosong Hu, Luoyang (CN); Bing Pian, Luoyang (CN); Bing Ji, Luoyang (CN); Wujie Zhang, Luoyang (CN)

(73) Assignees: Casi Vision Technology (Luoyang) Co., Ltd., Luoyang (CN); Casi Vision Technology (Beijing) Co., Ltd., Beijing (CN)

(*) Notice: Subject to any disclaimer, the term of this patent is extended or adjusted under 35 U.S.C. 154(b) by 663 days.

(21) Appl. No.: 18/276,768

(22) PCT Filed: Nov. 11, 2021

(86) PCT No.: PCT/CN2021/129992
§ 371 (c)(1),
(2) Date: Aug. 10, 2023

(87) PCT Pub. No.: WO2022/179187
PCT Pub. Date: Sep. 1, 2022

(65) Prior Publication Data

US 2024/0128712 A1 Apr. 18, 2024

(30) Foreign Application Priority Data

Feb. 25, 2021 (CN) ......................... 202110207122.8

(51) Int. Cl.
*H01S 5/042* (2006.01)
*H05B 45/345* (2020.01)
*H05B 45/3725* (2020.01)

(52) U.S. Cl.
CPC .......... *H01S 5/042* (2013.01); *H05B 45/345* (2020.01); *H05B 45/3725* (2020.01)

(58) Field of Classification Search
CPC .... H01S 5/042; H01S 5/06808; H01S 5/0617; H01S 5/0427; H01S 5/0428; H05B 45/32;
(Continued)

(56) References Cited

U.S. PATENT DOCUMENTS 7,166,826 B1 * 1/2007 Kunst .................. H01S 5/0683 372/33
9,748,734 B1 8/2017 Stiffler et al.
(Continued)

FOREIGN PATENT DOCUMENTS

CN 104253956 A * 12/2014
CN 108770130 A * 11/2018 ............ H05B 45/37
(Continued)

OTHER PUBLICATIONS

First Office Action dated Apr. 9, 2021 in connection with Chinese Application No. 202110207122.8 and English translation thereof.
(Continued)

*Primary Examiner* — Minsun O Harvey

(57) ABSTRACT

A voltage-adaptive laser driving circuit and a control method thereof. The circuit includes: a switching power supply, a laser, a constant current driving circuit, a current setting circuit, an MCU control circuit, a voltage acquisition circuit and a voltage setting circuit; the switching power supply is connected to the laser and the voltage setting circuit respectively and used for providing electrical energy for the laser and the voltage setting circuit; and the laser is connected to the switching power supply and the constant current driving circuit respectively and used for generating laser light.

12 Claims, 5 Drawing Sheets

(58) Field of Classification Search
CPC .... H05B 45/325; H05B 45/327; H05B 45/33; H05B 45/335; H05B 45/34; H05B 45/345; H05B 45/3725; H05B 45/14; H02M 3/156
See application file for complete search history.

(56) References Cited

U.S. PATENT DOCUMENTS

| | | | | |
|---|---|---|---|---|
| 11,013,081 | B1 * | 5/2021 | Yang | H05B 45/325 |
| 2013/0249406 | A1 | 9/2013 | Kim et al. | |

FOREIGN PATENT DOCUMENTS

| | | | | | |
|---|---|---|---|---|---|
| CN | 109378706 | A | * | 2/2019 | H01S 5/0428 |
| CN | 109950790 | A | | 6/2019 | |
| CN | 110137793 | A | * | 8/2019 | H01S 3/09 |
| CN | 209217430 | U | * | 8/2019 | |
| CN | 110391590 | A | * | 10/2019 | H01S 5/0428 |
| CN | 111629490 | A | | 9/2020 | |
| CN | 112365853 | A | * | 2/2021 | G09G 3/3406 |
| CN | 112436719 | A | | 3/2021 | |
| CN | 112512176 | A | * | 3/2021 | H05B 45/36 |
| CN | 112582876 | A | | 3/2021 | |
| CN | 113036588 | A | * | 6/2021 | H01S 3/094 |
| CN | 113646824 | A | * | 11/2021 | G09G 3/32 |
| WO | WO-2016072995 | A1 | * | 5/2016 | H02J 7/865 |
| WO | WO-2020253448 | A1 | * | 12/2020 | H04N 9/3161 |
| WO | WO-2021032995 | A1 | * | 2/2021 | H05B 45/3725 |

OTHER PUBLICATIONS

Notification to Grant Patent Right dated Apr. 29, 2021 in connection with Chinese Application No. 202110207122.8 and English translation thereof.

International Search Report and Written Opinion mailed Feb. 15, 2022 in connection with International Application No. PCT/CN2021/129992.

* cited by examiner

VOLTAGE-ADAPTIVE LASER DRIVING CIRCUIT AND CONTROL METHOD THEREOF

CROSS-REFERENCE TO RELATED APPLICATION

This application is a national stage under 35 U.S.C. § 371 of International Application No. PCT/CN2021/129992, filed Nov. 11, 2021, and entitled "VOLTAGE-ADAPTIVE LASER DRIVING CIRCUIT AND CONTROL METHOD THEREOF." International Application No. PCT/CN2021/129992 claims the benefit of Chinese Patent Application No. 202110207122.8, filed with the Chinese Patent Office on Feb. 25, 2021, and entitled "VOLTAGE-ADAPTIVE LASER DRIVING CIRCUIT AND CONTROL METHOD THEREOF." The contents of these applications are herein incorporated by reference in their entirety.

TECHNICAL FIELD

The present disclosure relates to the technical field of laser drive circuits, in particular to a constant current drive circuit for voltage-adaptive numerical-control laser and control method thereof.

BACKGROUND ART

Currently, the lasers have been widely used in daily life of people, industrial production, medical equipment, aerospace, special equipment or military weapons. LD semiconductor lasers are relatively common among lasers, and because of their mature production process and relatively low cost, they have been widely used in fields such as long-distance optical fiber communication, wireless communication, laser marking, laser ranging, laser radar, laser weapons.

LD lasers are generally driven by a constant current. Generally, the output current of the laser is a constant current or a current signal modulated by PWM, wherein the amplitude of the driving current thereof is generally constant. Ordinary lasers have poor ability to resist surge, when a large surge current or current overshoot is occurred during work, it is easy to reduce the lifespan of the laser or damage the laser.

In some special applications, such as laser marking, laser radar and laser weapons, it is always required that the pulse width of the driving constant current of the laser is controllable and that its current value can be regulated. In some other applications, it is required that the constant current drive circuit of the laser can be directly connected to different types of lasers for use, or that multiple lasers are used to be connected in series to increase the laser output power of the entire system, which requires that the circuit can use the operating voltage of different types of lasers, and can output adjustable current and pulse.

Products or solutions in the prior art involve constant current drive circuits for some lasers. For example, the patent CN109950790A "Laser Control Circuit, and Laser Device" proposes a constant current drive circuit to realize the operation of lasers with different junction voltages, but this solution can only output a constant current, and the power supply voltage is regulated through an external adjustable resistor; the patent CN111355121A "Double Pulse Laser Drive System, Drive Circuit and Drive Method" proposes a double-pulse LD laser constant current drive circuit and method thereof, but the power supply of this solution is not adjustable and this solution requires two input signals to control to generate double pulse, which limits its application; the patent CN110445011A "Laser Power Supply Constant Current Drive Circuit and Method thereof" mainly solves the problem of stability and lifespan of the laser in use, which does not take the operation efficiency of the laser and the application of PWM pulse width modulation into account; and the patent CN105208739B "Laser Light Source Constant Current Drive Device" proposes a constant current output laser drive circuit powered by a DC/DC power supply, which does not realize the regulation of the laser voltage and the PWM pulse width modulation of the laser.

SUMMARY

The technical problem to be solved by the present disclosure is to provide a laser constant current drive circuit that has a PWM pulse width modulation output function, in which the operating voltage of the laser is self-adaptive. The circuit of the present disclosure adopts 4-way AD chips to collect the input power supply voltage, the positive voltage of the laser, the negative voltage of the laser and the voltage on the sampling resistor; then after passing through the voltage-follower and sampled by AD, the voltage is input to the Microcontroller Unit (MCU) as a parameter for PID adjustment and the output voltage of controlling the switching power supply is feedback, so as to control the voltage drop of the power MOSFET (Metal-Oxide-Semiconductor Field-Effect Transistor) in the constant current drive circuit, thereby reducing heat dissipation and achieving higher efficiency. At the same time, the analog switch chip is used as the control switch of the PWM signal, and the output voltage of multi-way DA conversion circuit is used as the reference value of the output current, and the MCU is used to realize the setting for pulse width and frequency, which can easily realize adjustment of strobing and step current.

In order to solve the above technical problems, the present disclosure further provides a voltage-adaptive laser drive circuit, including a switching power supply 1, a laser 2, a constant current drive circuit 3, a current setting circuit 4, a MCU control circuit 5, a voltage sampling circuit 6, and a voltage setting circuit 7.

The switching power supply 1 is respectively connected to the laser 2 and the voltage setting circuit 7, and configured to provide electric energy for the laser 2 and the voltage setting circuit 7.

The laser 2 is respectively connected to the switching power supply 1 and the constant current drive circuit 3 for generating light.

The constant current drive circuit 3 is respectively connected to the laser 2 and the current setting circuit 4, and configured to control the current passing through the laser 2 to be a constant current.

The current setting circuit 4 is respectively connected to the constant current drive circuit 3 and the MCU control circuit 5, and configured to correspondingly output an analog voltage according to the output current of the constant current drive circuit 3.

The MCU control circuit 5 is respectively connected to the current setting circuit 4, the voltage sampling circuit 6, and the voltage setting circuit 7, and configured to realize the numerical-control adjustment of the voltage-adaptive laser drive circuit.

The voltage sampling circuit 6 collects the output voltage of the switching power supply 1, the input voltage of the laser 2, the output voltage of the laser 2, and the voltage of the sampling resistor in the constant current drive circuit 3, and then provides them for the MCU control circuit 5 for collecting analog voltage to realize digital control.

The voltage setting circuit 7 is respectively connected to the MCU control circuit 5 and the switching power supply 1, and configured to output voltage to the switching power supply 1 to realize linear adjustment for the output voltage.

Preferably, the current setting circuit 4 further includes a digital-control analog-voltage setting-and-selecting output circuit. The current setting circuit 4 further includes a multi-channel DA chip and a multi-channel analog switch chip, wherein the DA chip outputs voltage to the analog switch chip.

Preferably, the constant current drive circuit 3 is a current series-connection negative feedback structure. The voltage of the current sampling resistor is applied to the input negative terminal of the operational amplifier. The output signal of the current setting circuit 4 is transmitted to one terminal of the current limiting resistor, and the other terminal of the current limiting resistor is connected to the input positive terminal of the operational amplifier, and the output signal of the operational amplifier is transmitted to the grid of the power MOSFET.

Preferably, the constant current drive circuit 3 is a current parallel-connection negative feedback structure, wherein one terminal of the parallel resistor is connected to the input negative terminal of the operational amplifier, and the other terminal is connected to the input terminal of the current sampling resistor. One terminal of the current limiting resistor receives the output signal of the analog switch chip, the other terminal of the current limiting resistor is connected to the input negative terminal of the operational amplifier, the positive terminal of the operational amplifier is connected to the output terminal of the reference voltage chip, and the output signal of the operational amplifier is transmitted to the gate of the power MOSFET.

Preferably, the MCU control circuit 5 is further configured to perform PID setting on the output voltages of the voltage setting circuit 7 and the switching power supply 1.

Preferably, the switching power supply 1 further includes an input voltage VCC, an output voltage OUT, a reset signal RESET and a voltage regulation pin FB.

Preferably, the laser 2 is a laser driven by a constant current.

Preferably, the constant current drive circuit 3 is set in a linear constant current control mode, wherein its topological structure is a current series-connection negative feedback structure, or a current parallel-connection negative feedback structure.

Preferably, the voltage setting circuit 7 further includes a DA conversion circuit, wherein the output terminal of the DA conversion circuit is connected to one terminal of the voltage setting resistor, and the other terminal of the voltage setting resistor is connected to the switching power supply 1.

Preferably, the laser 2 is replaced with an LED light source.

In order to solve the above-mentioned technical problems, the present disclosure also provides a control method for the voltage-adaptive laser drive circuit, including the following steps:

Step 1, after starting up, setting the input voltage VFB of the switching power supply 1 to be 0V, and at this time, setting the output voltage Vout of the switching power supply 1 to be the maximum value;

Step 2, according to the value of step current set by the user, selecting the maximum output step current Imax of the step current passing through the laser 2, and controlling the output voltage during this period;

Step 3, acquiring, by the voltage sampling circuit 6, the input voltage VLD+ of the laser 2, the output voltage VLD− of the laser 2, and the voltage VRS of the sampling resistor of the constant current drive circuit 3, and calculating the operating voltage VLD at two terminals of the laser 2;

Step 4, calculating the power heat dissipation of the MOSFET in the constant current drive circuit 3;

Step 5, according to the preset value PH of the power heat dissipation of the MOSFET in the constant current drive circuit 3, determining the voltage drop VDS across the drain and the source of the MOSFET;

Step 6, calculating the output voltage Vout of the switching power supply 1;

Step 7, calculating the numerical value of the output voltage VT of the DA chip of the voltage setting circuit 7, and then controlling the output voltage VT of the DA chip of the voltage setting circuit 7 by gradually increasing VT via the MCU control circuit 5; and Step 8, controlling the voltage sampling circuit 6 by the MCU control circuit 5 to sample the operating voltage of each point again, according to the output voltage Vout of the switching power supply 1 and the value of the VT of the DA chip of the voltage setting circuit 7, comparing the actual power consumption of the MOSFET with the preset power consumption, to realize the closed-loop control of PID of output voltage value.

In the above, VFB is the input voltage of the switching power supply 1; Vout is the output voltage of the switching power supply 1; Imax is the maximum output step current in the step current passing through the laser 2; VLD+ is the input voltage of the laser 2; VLD− is the output voltage of the laser 2; VRS is the voltage of the sampling resistor of the constant current drive circuit 3; VLD is the operating voltage at two terminals of the laser 2; VDS is the voltage drop across the drain and source of the MOSFET in the constant current drive circuit 3; and VT is the output voltage of the DA chip of the voltage setting circuit 7.

Preferably, realizing the closed-loop control of PID of output voltage value further includes controlling, by the MCU control circuit 5, the switching power supply 1, the laser 2, the constant current drive circuit 3, the voltage sampling circuit 6, and the voltage setting circuit 7 for voltage output, to realize the circuit adjustment.

Preferably, the laser 2 is replaced with an LED light source.

The present disclosure includes the following beneficial effects.

(1) The current setting circuit takes the output voltage of the multi-way DA conversion circuit as the reference value of the output current. The pulse width and current are selected by the analog switch circuit, which realizes the step current adjustment by the amplitude of pulse of the laser and the function of independently setting the pulse width, such that amplitude, pulse width and frequency of the output current can be precisely controlled through the MCU.

(2) The MCU control circuit controls the output voltages of the voltage setting circuit and the switching power supply for PID feedback adjustment, wherein the MCU control circuit controls the switching power supply, laser, constant current drive circuit, voltage sampling circuit and voltage setting circuit to regulate the output voltage of the switching power supply.

(3) The voltage sampling circuit collects 4-way AD voltages and feeds them back to the MCU for numerical-control PID adjustment, so that the output voltage of the switching power supply can be automatically regulated according to the operating voltage of the laser and the voltage drop across the drain and source of the MOSFET to achieve high efficiency.

(4) Two constant current source control circuits are given, wherein one is the current series-connection negative feedback circuit, and the other is the current parallel-connection negative feedback output circuit, which can accomplish most applications of linear constant current driver in lasers.

BRIEF DESCRIPTION OF DRAWINGS

In order to more clearly illustrate the technical solutions in the embodiments of the present disclosure or the prior art, the following will briefly introduce the drawings required in the description of the embodiments or the prior art. Obviously, the drawings in the following description are only part of the embodiments or the prior art. For those ordinarily skilled in the art, other similar or related drawings can also be obtained according to these drawings without inventive effort.

DETAILED DESCRIPTION OF EMBODIMENTS

Figure 1:
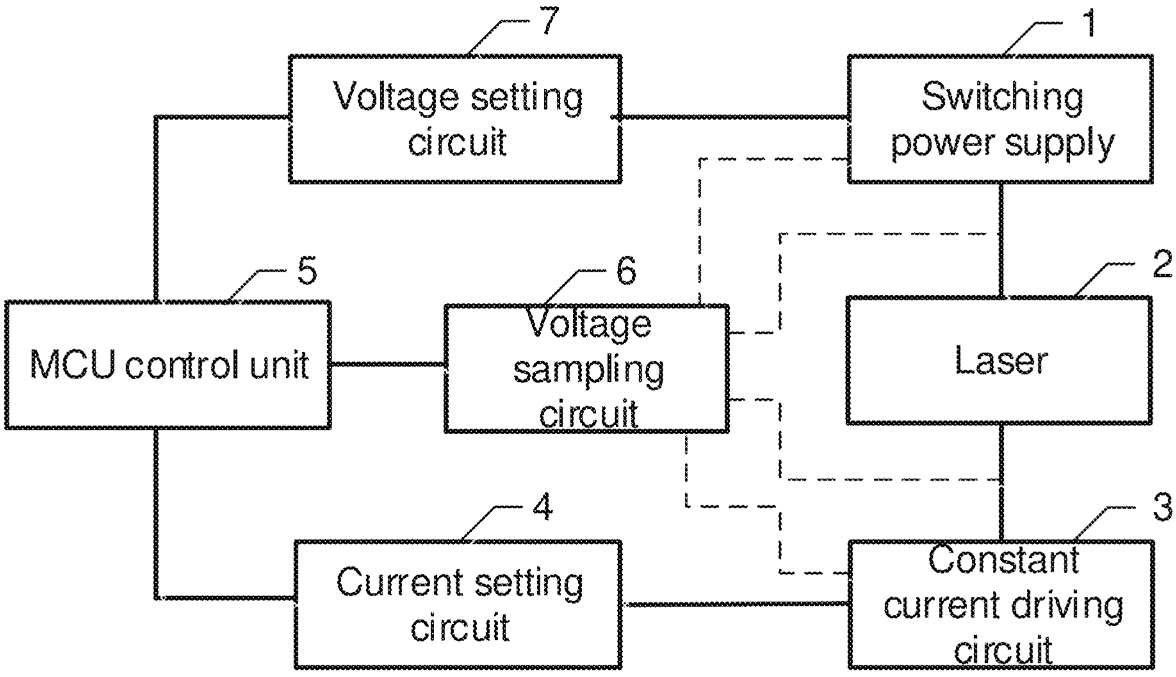
FIG. 1 is a block diagram of implementing the voltage-adaptive laser drive circuit according to an embodiment of the present disclosure.

The present disclosure is described in detail below in conjunction with embodiments. In order to make the purpose, technical solutions and advantages of the present disclosure clearer and more explicit, the present disclosure will be further described in detail below, but the present disclosure is not limited to these embodiments.

The present disclosure relates to a constant current drive circuit for voltage-adaptive numerical-control laser, including a switching power supply 1, a laser 2, a constant current drive circuit 3, a current setting circuit 4, an MCU control circuit 5, a voltage sampling circuit 6, and a voltage setting circuit 7, wherein the MCU control circuit 5 realizes the numerical-control adjustment for the system, the voltage sampling circuit 6 is a digital-control 4-channel analog-voltage sampling circuit, the current setting circuit 4 provides an output voltage for the constant current drive circuit to realize the constant current output, and the voltage setting circuit 7 outputs a voltage to the switching power supply to realize self-adaptive adjustment according to the characteristics of the operating voltage of the laser. In the present disclosure, the PID adjustment of the voltage sampling circuit and the voltage setting circuit is accomplished by the MCU control circuit, so as to realize the self-adaptive change of the output voltage of the switching power supply according to the working state of the laser and the constant current circuit, and the PWM high-speed strobing function is realized by regulating the current setting circuit through the MCU control circuit.

The voltage sampling circuit 6 collects the output voltage of the switching power supply 1, the input voltage of the laser 2, the output voltage of the laser 2, and the voltage of the sampling resistor in the constant current drive circuit 3, and provides them for the MCU control circuit 5 for collecting analog voltage to realize digital control.

Embodiment 1

As shown in FIG. 1, FIG. 1 is a block diagram for realizing the voltage-adaptive laser drive circuit according to the embodiment of the present disclosure, including a switching power supply 1, a laser 2, a constant current drive circuit 3, a current setting circuit 4, an MCU control circuit 5, a voltage sampling circuit 6 and a voltage setting circuit 7.

The switching power supply supplies power to the laser. The switching power supply can be realized through many ways, which can adopt a non-isolated topological structure or an isolated switching power supply topological structure. The characteristic of the switching power supply is that the external performance of the switching power supply should include input voltage VCC, output voltage OUT, reset signal RESET and voltage regulation pin FB.

The laser is an LD laser or other types of lasers driven by constant current. The laser can also be in the form of an external terminal, and the user can access the desired laser according to the needs.

The constant current drive circuit controls the current passing through the laser to be a constant current, wherein the constant current drive circuit adopts a linear constant current control method, and its topological structure can be a current series-connection negative feedback structure or a current parallel-connection negative feedback structure.

The current setting circuit is a digital-control analog-voltage setting-and-selecting output circuit, wherein the current setting circuit is composed of a multi-channel DA chip and a multi-channel analog switch. The output voltage of the DA chip is provided for the input of the analog switch chip. The number of output channels of the DA chip should correspond to the number of input channels of the analog switch chip, and the current setting circuit is communicatively controlled by the MCU.

The MCU control circuit can be a microprocessor circuit, a CUP circuit, an ARM circuit or an FPGA circuit.

The voltage sampling circuit is a digital-control 4-channel analog-voltage sampling circuit. The 4-way AD chip collects the input power supply voltage, the positive voltage of the laser, the negative voltage of the laser and the voltage on the sampling resistor. The voltage is applied to the MCU as a parameter for PID adjustment. The output voltage of the switching power supply is subjected to feedback control. The adjustment for PID feedback signal is realized by software, so as to control the voltage drop of the MOSFET in the constant current drive circuit, thereby reducing heat dissipation and achieving higher efficiency.

The MCU communicatively controls output voltage of voltage setting circuit, which is applied to the switching power supply, thereby controlling the output voltage of the switching power supply to perform linear adjustment.

Figure 2:
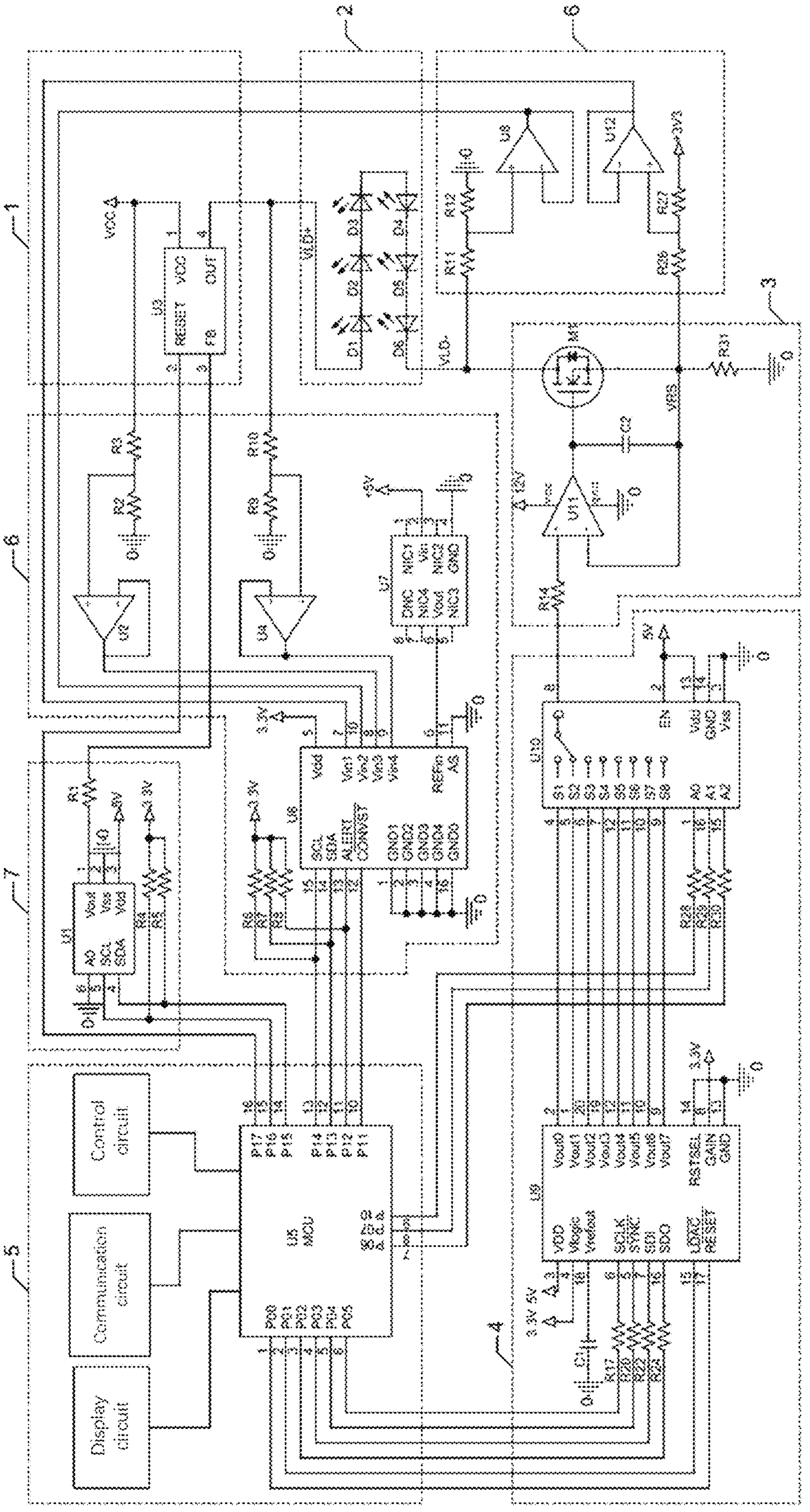
FIG. 2 is a circuit diagram of a first implementation of the voltage-adaptive laser drive circuit according to an embodiment of the present disclosure.

As shown in FIG. 2, FIG. 2 is a circuit diagram of a first implementation of a voltage-adaptive laser drive circuit according to an embodiment of the present disclosure. The external interface of the switching power supply includes VCC, OUT, RESET, and FB, wherein the input voltage VCC is connected to an external power supply to provide power, the output voltage OUT is connected to the input positive terminal of the laser, the reset signal RESET is connected to one of the pins P17 of the MCU control circuit, and the voltage regulation pin FB is connected to one terminal of the output resistor R1 of the voltage regulating circuit.

The constant current drive circuit is of a current series-connection negative feedback structure, wherein the linear constant current power tube is M1, the current sampling resistor is R31, the voltage of the sampling resistor is applied to the input negative terminal of the operational amplifier U11, the output signal of the analog switch circuit 4 is transmitted to one terminal of the resistor R14, the other terminal of the resistor R14 is connected to the input positive terminal of the operational amplifier U11, and the output signal of the operational amplifier U11 is transmitted to the gate of the power MOSFET. At this time, the calculation formula of the output current is:

$$I_{out} = \frac{V_D}{R_S}. \quad \text{Formula 1}$$

In Formula 1, VD is the voltage at the connection point between the resistor R14 and the analog switch circuit, and RS is the resistance value of the sampling resistor R31.

The core chip of the current setting circuit adopts 8-way 12-bit DA chip, wherein the output voltage signals are Vout0, Vout1, Vout2, Vout3, Vout4, Vout5, Vout6, and Vout7. The current setting circuit uses SPI interface to communicate with MCU, wherein the communication signals are SCLK, SYNC, SDI, SDO, LDAC and RESET, wherein SCLK, SYNC, SDI and SDO are respectively connected in series with resistors R17, R20, R22 and R24 and then connected to the MCU. The analog switch chip adopts an single 8-channel analog switch, and the channel-selection control signals are 3-bit A2, A1 and A0 signals, which are respectively connected in series with resistors R30, R29 and R28 and connected to the control terminals of the MCU; the 8-channel signal input terminals S8, S7, S6, S5, S4, S3, S2 and S1 of the analog switch chip are respectively connected to the output signal of the DA chip; and the output signal terminal of the analog switch chip is D, wherein the output signal is provided for the constant current drive circuit.

The MCU control circuit can be selected to be connected to the display circuit, communication circuit, and control circuit. The display circuit is used to display the working status and output condition of the circuit. The communication circuit is used to communicate with the upper machine or perform remote control. The control circuit is used to configure the working status and output value.

The signal pins P06, P07 and P10 of the MCU control circuit are respectively connected in series to the resistors R30, R29, and R28 to be connected to the signal-selection terminals A2, A1, and A0 of the analog switch circuit; the signal pins P00, P01 are respectively connected to LDAC and RESET of the current setting circuit; the signal pins P02, P03, P04, P05 are respectively connected to SDO, SDI, SYNC and SCLK of the current setting circuit through resistors R24, R22, R20, R17; the signal pins P11, P12, P13, P14 are connected to CONVST, ALERT, SDA and SCL of the voltage sampling circuit; and the signal pins P15, P16, and P17 are connected with A0, SCL and SDA pins of the voltage setting circuit.

The voltage sampling circuit adopts the 4-way DA voltage conversion chip U6 with I2C interface. The signals SCL, SDA, ALERT, and CONVEST of U6 are connected to the terminals P14, P13, P12, and P11 of the MCU control circuit, and the signal pins SCL, SDA, and ALERT are pulled up to 3.3V voltage via resistors R6, R7, R8.

Resistors R26 and R27 obtain the sampling resistor voltage VRS of constant current drive circuit and divide the voltage, wherein the signal after dividing the voltage is provided for the operational amplifier U12 for following and then input to Vin1 of U6.

Resistors R11 and R12 obtain the negative voltage VLED– of the LED light source and divide the voltage, wherein the signal after voltage division is provided for the operational amplifier U8 for following and then input to Vin2 of U6.

Resistors R2 and R3 obtain the input voltage VCC of the switching power supply and divide the voltage, wherein the signal after voltage division is provided for the operational amplifier U2 for following and then input to Vin3 of U6.

Resistors R9 and R10 obtain the positive voltage VLED+ of the LED light source and divide the voltage, wherein the signal after voltage division is provided for the operational amplifier U4 for following and then input to Vin4 of U6.

The voltage setting circuit adopts a single-way DA chip, the input control signal adopts I2C interface, and the signal pins are SCL and SDA. The input signals are transmitted to the communication pins of the MCU, which are pulled up by the resistors R4 and R5 respectively.

The output signal is connected to one terminal of the resistor R1, and the other terminal of the resistor R1 is connected to the FB pin of the switching power supply.

The drive circuit in the present disclosure can be used to drive the laser, and can also be used to drive the LED light source.

Embodiment 2

Figure 3:
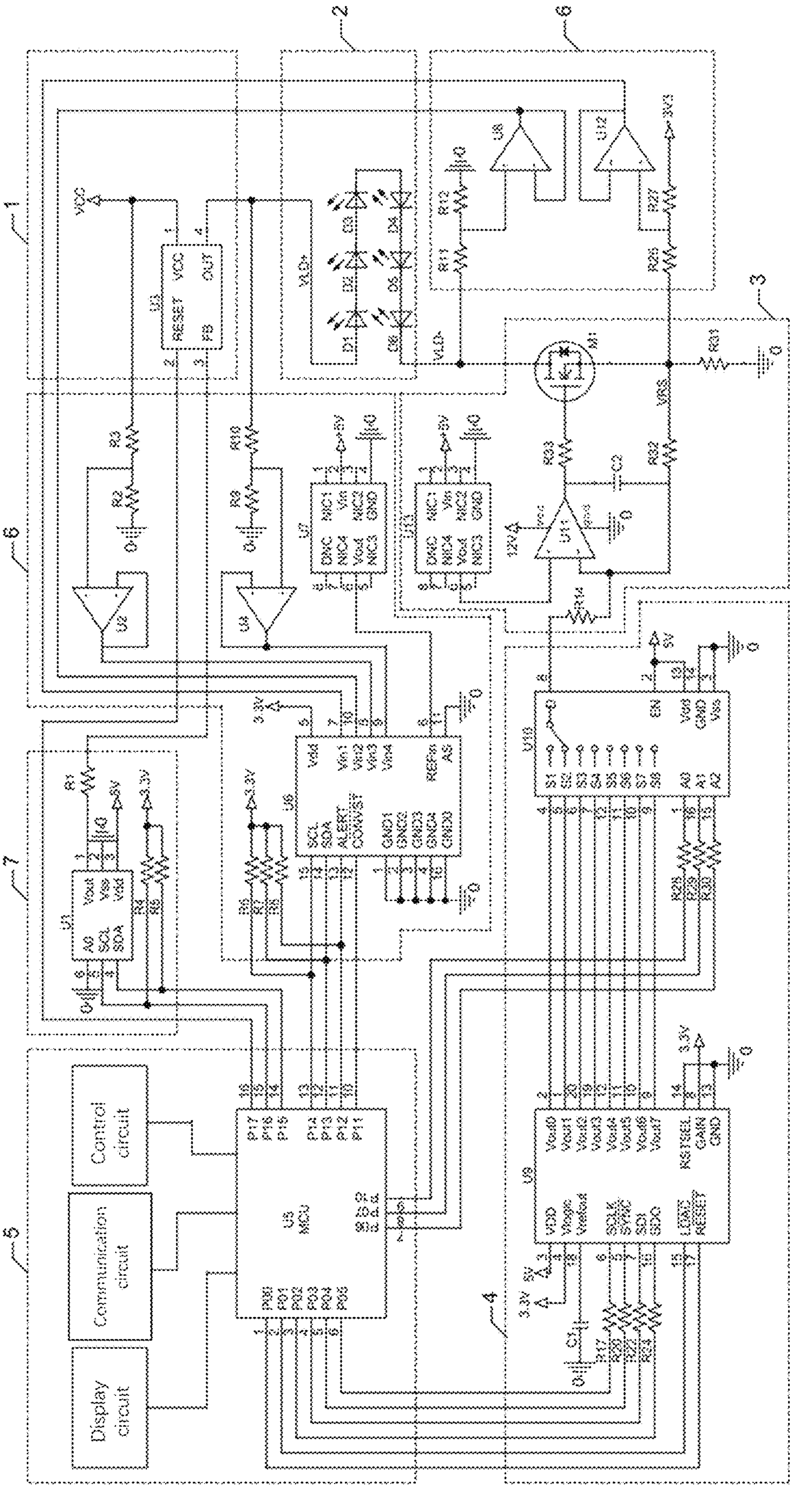
FIG. 3 is a circuit diagram of a second implementation of the voltage-adaptive laser drive circuit according to the embodiment of the present disclosure.

As shown in FIG. 3, FIG. 3 is a circuit diagram of the second implementation of the voltage-adaptive laser drive circuit according to the embodiment of the present disclosure. The difference from Embodiment 1 is that the constant current drive circuit 3 is of a current parallel-connection negative feedback structure, wherein the linear constant current power tube is M1, current sampling resistor is R31, one terminal of the resistor R32 is connected to the input negative terminal of the operational amplifier, and the other terminal is connected to the input terminal of current sampling resistor R31; one terminal of resistor R14 is connected to the output signal of current setting circuit 4, the other terminal of resistor R14 is connected to the input negative terminal of operational amplifier U11, the positive terminal of operational amplifier U11 is connected to the output terminal of reference voltage chip U13, and the output signal of operational amplifier U11 is transmitted to the gate of the power MOSFET M1. The calculation formula of the output current at this time is:

$$I_{out} = \frac{V_{REF}}{R_S}(1 + K_1) - \frac{V_D}{R_S} \cdot K_1. \quad \text{Formula 2}$$

In Formula 2, VD is the voltage at the connection point between the resistor R14 and the analog switch chip, RS is the resistance value of the sampling resistor R31, VREF is the reference voltage value of the positive terminal of the operational amplifier U11, and K1 is the ratio of the resistor R32 to the resistor R14.

Embodiment 3

Figure 4:
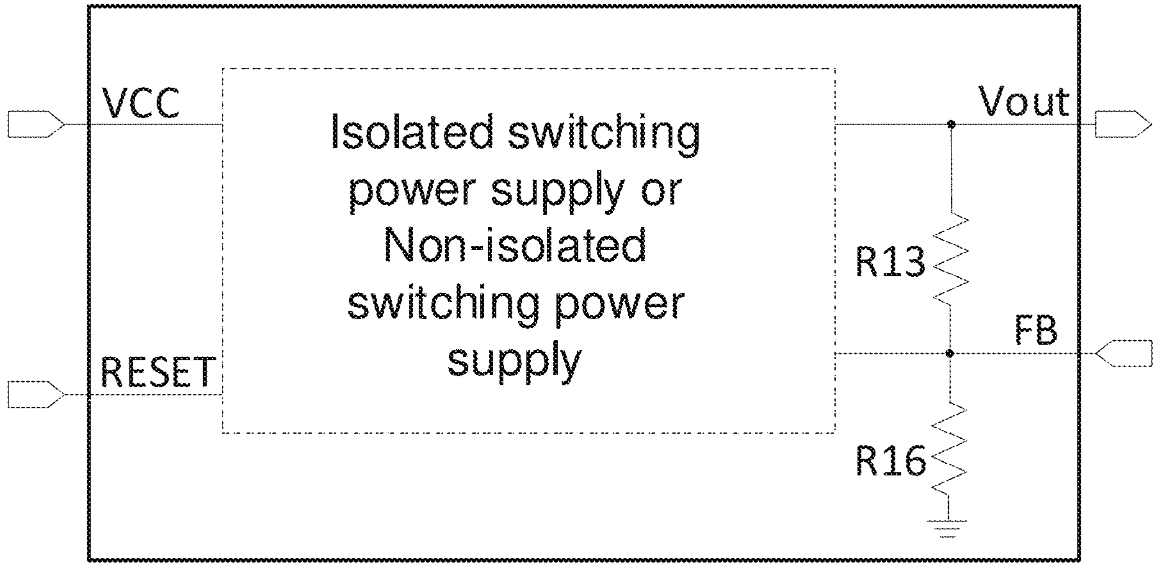
FIG. 4 is a block diagram of the internal implementation of the switching power supply according to the embodiment of the present disclosure.

As shown in FIG. 4, FIG. 4 is a block diagram of the internal implementation of the switching power supply according to the embodiment of the present disclosure. In Embodiment 1 or Embodiment 2, the MCU control circuit controls the output voltages of voltage setting circuit and switching power supply to set, and the internal circuit diagram of switching power supply is as shown in FIG. 4. The user can choose either a topological structure of an isolated switching power supply or a topological structure of a non-isolated switching power supply. The output voltage is calculated according to Formula 3. If the output voltage needs to be lowered, it can be achieved by increasing the voltage value of VT. If the output voltage needs to be increased, the voltage value of VT needs to be lowered. The input terminal of the switching power supply is respectively connected to the input voltage VCC and the reset signal RESET. The output terminal of the switching power supply is the output voltage VOUT, and the output voltage VOUT is connected to the voltage regulation pin FB through the resistor R13. The resistor R13 is connected between the output voltage VOUT and the voltage regulation pin FB, and a resistor R16 is connected between the voltage regulation pin FB and the ground. At this time, the calculation formula of the open-loop setting for output voltage is:

$$V_{out}=(K_2+K_3+1)\cdot V_{FB}-K_3\cdot V_T \quad \text{Formula 3.}$$

In Formula 3, Vout is the output voltage of the switching power supply; VT is the output voltage of the DA conversion circuit in the voltage setting circuit; VFB is the input voltage of the switching power supply circuit, which is the reference pin of the output voltage Vout, and also known as the output feedback pin, which is connected to the input terminal of the internal error amplifier to set the output voltage; K2 is the ratio of the resistor R13 to the resistor R16; and K3 is the ratio of the resistor R13 to the resistor R1.

Embodiment 4

Figure 5:
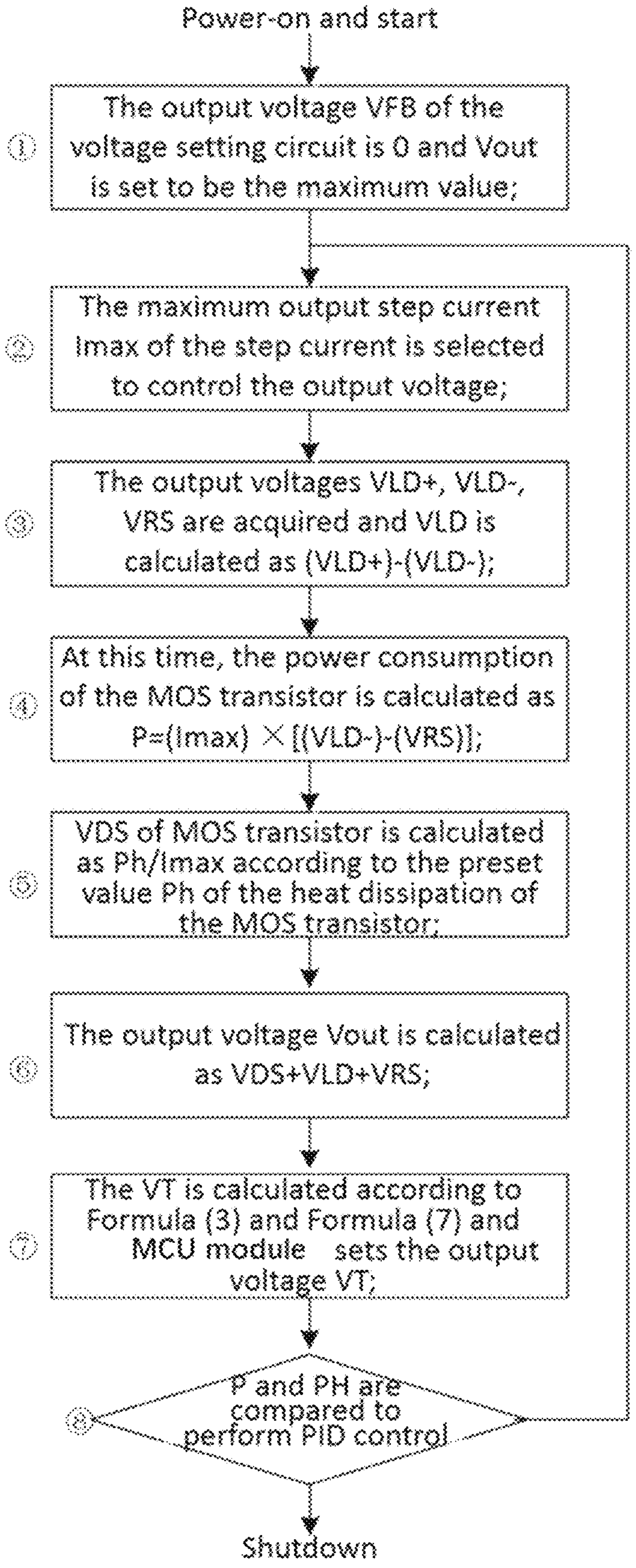
FIG. 5 is a flowchart of a control method for the numerical-control function of the output voltage adjustment according to the embodiment of the present disclosure.

As shown in FIG. 5, FIG. 5 is a flowchart of the control method for the output-voltage regulation numerical-control function according to the embodiment of the present disclosure. The MCU control circuit described in the method controls the switching power supply, the laser, the constant current drive circuit, the voltage sampling circuit, and the voltage setting circuit to regulate the output voltage of the switching power supply. The steps are specifically as follows:

Step 1, after starting up, setting the output voltage VFB of the voltage setting circuit to be 0, and Vout to be the maximum value;

Step 2, selecting the maximum output step current Imax in the step current according to the step current value configured by the user, and controlling the output voltage in this cycle;

Step 3, collecting the output voltages VLD+, VLD−, VRS by the voltage sampling circuit, and calculating the operating voltage VLD at two terminals of the LD light source as:

$$V_{LD}=V_{LD+}-V_{LD-} \quad \text{Formula 4;}$$

Step 4, at this time, calculating the power consumption of the MOSFET as:

$$P=I_{max}\times(V_{LD-}-V_{RS}) \quad \text{Formula 5;}$$

Step 5, according to the preset value PH of the power heat dissipation of the MOSFET, determining the voltage drop VDS across the drain and source of the power MOSFET:

$$V_{DS}=_{H}/I_{max} \quad \text{Formula 6;}$$

Step 6, calculating the output voltage Vout:

$$V_{out}=V_{DS}+V_{LD}+V_{RS} \quad \text{Formula 7;}$$

Step 7, calculating the value of VT according to Formula 3 and Formula 7, and then controlling the output voltage VT of the voltage setting circuit 7 through the MCU control circuit 5 by the way of gradually increasing VT; and Step 8, sampling the operating voltage of each point again by controlling the voltage sampling circuit through the MCU, and comparing the actual power consumption of the MOSFET with the preset power consumption Ph according to the values of Vout and VT, so as to realize the closed-loop control of PID of the output voltage value.

In the above, VFB is the input voltage of the switching power supply 1; Vout is the output voltage of the switching power supply 1; Imax is the maximum output step current in the step current passing through the laser 2; VLD+ is the input voltage of the laser 2; VLD− is the output voltage of the laser 2; VRS is the voltage of the sampling resistor of the constant current drive circuit 3; VLD is the operating voltage at two terminals of the laser 2; VDS is the voltage drop between the drain and the source of the MOSFET in the constant current drive circuit 3; and VT is the output voltage of the DA chip of the voltage setting circuit 7.

The above contents are only a few embodiments of the present disclosure, and do not limit the present disclosure in any way. Although the present disclosure is disclosed above by the preferred embodiments, but it is not intended to limit the present disclosure. For any person skilled in the art, without departing from the scope of the technical solution of the present disclosure, using the above revealed technical content to make minor changes or modifications is equivalent to the equivalent implementation, which are all within the scope of protection of the technical solution of the present disclosure.

What is claimed is:

1. A voltage-adaptive laser drive circuit, comprising a switching power supply, a laser, a constant current drive circuit, a current setting circuit, a Microcontroller Unit (MCU) control circuit, a voltage sampling circuit and a voltage setting circuit, wherein the switching power supply is respectively connected to the laser and the voltage setting circuit, and configured to provide electric energy for the laser and the voltage setting circuit;

the laser is respectively connected to the switching power supply and the constant current drive circuit for generating light;

the constant current drive circuit is connected to the laser and the current setting circuit, respectively, and configured to control a current passing through the laser to be a constant current;

the current setting circuit is respectively connected to the constant current drive circuit and the MCU control circuit, and configured to correspondingly output an analog voltage according to an output current of the constant current drive circuit;

the MCU control circuit is respectively connected to the current setting circuit, the voltage sampling circuit and the voltage setting circuit, and configured to perform a numerical-control adjustment for the voltage-adaptive laser drive circuit;

the voltage sampling circuit is connected to the MCU control circuit, and configured to collect an analog voltage to realize digital control; and the voltage setting circuit is respectively connected to the MCU control circuit and the switching power supply, and configured to output a voltage to the switching power supply to realize a linear adjustment for the output voltage;

wherein the constant current drive circuit is of a current parallel-connection negative feedback structure, wherein a parallel resistor has one terminal connected to an input negative terminal of an operational amplifier and the other terminal connected to an input terminal of a current sampling resistor; one terminal of a current limiting resistor receives an output signal of an analog switch chip, and the other terminal of the current limiting resistor is connected to an input negative terminal of the operational amplifier; a positive terminal of the operational amplifier is connected to an output terminal of a reference voltage chip; and an output signal of the operational amplifier is transmitted to a gate of a power MOSFET.

2. The voltage-adaptive laser drive circuit according to claim 1, wherein the current setting circuit further comprises a digital-control analog-voltage setting circuit and a selecting output circuit; and the current setting circuit further comprises a multi-channel DA chip and a multi-channel analog switch chip, wherein the DA chip outputs a voltage to the analog switch chip.

3. The voltage-adaptive laser drive circuit according to claim 1, wherein the constant current drive circuit is of a current series-connection negative feedback structure, wherein a voltage of a current sampling resistor is applied to an input negative terminal of an operational amplifier; an output signal of the current setting circuit is transmitted to one terminal of a current limiting resistor, and the other terminal of the current limiting resistor is connected to an input positive terminal of the operational amplifier; and an output signal of the operational amplifier is transmitted to a gate of a power MOSFET.

4. The voltage-adaptive laser drive circuit according to claim 1, wherein the MCU control circuit is further configured to perform a PID setting on output voltages of the voltage setting circuit and the switching power supply.

5. The voltage-adaptive laser drive circuit according to claim 1, wherein the switching power supply further comprises an input voltage VCC, an output voltage OUT, a reset signal RESET, and a voltage regulation pin FB.

6. The voltage-adaptive laser drive circuit according to claim 1, wherein the laser is a laser driven by a constant current.

7. The voltage-adaptive laser drive circuit according to claim 1, wherein the constant current drive circuit is set in a linear constant current control mode, and has a topological structure of a current series-connection negative feedback structure or a current parallel-connection negative feedback structure.

8. The voltage-adaptive laser drive circuit according to claim 1, wherein the voltage setting circuit further comprises a DA conversion circuit, wherein an output terminal of the DA conversion circuit is connected to one terminal of a voltage setting resistor, and the other terminal of the voltage setting resistor is connected to the switching power supply.

9. A control method for the voltage-adaptive laser drive circuit according to claim 1, comprising following steps:

step 1, setting, after starting up, an input voltage VFB of a switching power supply to be 0 V, and setting an output voltage Vout of the switching power supply to be a maximum value at this time;

step 2, selecting a maximum output step current Imax of a step current passing through a laser according to a step current value configured by a user, during which cycle an output voltage is controlled;

step 3, acquiring an input voltage VLD+ of the laser, an output voltage VLD− of the laser, and a voltage VRS of a sampling resistor of a constant current drive circuit by a voltage sampling circuit, and calculating an operating voltage VLD at two terminals of the laser;

step 4, calculating a power heat dissipation of an MOSFET in the constant current drive circuit;

step 5, determining a voltage drop VDS across a drain and a source of the MOSFET according to a preset value PH of the power heat dissipation of the MOSFET in the constant current drive circuit;

step 6, calculating an output voltage Vout of the switching power supply;

step 7, calculating a value of an output voltage VT of a DA chip of a voltage setting circuit, and then controlling the output voltage VT of the DA chip of the voltage setting circuit by gradually increasing VT via an MCU control circuit; and step 8, controlling the voltage sampling circuit by the MCU control circuit to sample an operating voltage of each point again, and comparing an actual power consumption of the MOSFET with a preset power consumption to realize a closed-loop control of PID of an output voltage value according to the output voltage Vout of the switching power supply and a value of VT of the DA chip of the voltage setting circuit.

10. The control method for the voltage-adaptive laser drive circuit according to claim 9, wherein realizing the closed-loop control of PID of the output voltage value further comprises controlling, by the MCU control circuit, the switching power supply, the laser, the constant current drive circuit, the voltage sampling circuit and the voltage setting circuit for voltage output, so as to realize a circuit adjustment.

11. A voltage-adaptive LED drive circuit, comprising a switching power supply, an LED, a constant current drive circuit, a current setting circuit, an MCU control circuit, a voltage sampling circuit and a voltage setting circuit, wherein the switching power supply is respectively connected to the LED and the voltage setting circuit, and configured to provide electric energy for the LED and the voltage setting circuit;

the LED is respectively connected to the switching power supply and the constant current drive circuit for generating light;

the constant current drive circuit is connected to the LED and the current setting circuit, respectively, and configured to control a current passing through the LED to be a constant current;

the current setting circuit is respectively connected to the constant current drive circuit and the MCU control circuit, and configured to correspondingly output an analog voltage according to an output current of the constant current drive circuit;

the MCU control circuit is respectively connected to the current setting circuit, the voltage sampling circuit and the voltage setting circuit, and configured to perform a numerical-control adjustment for the voltage-adaptive LED drive circuit;

the voltage sampling circuit is connected to the MCU control circuit, and configured to collect an analog voltage to realize digital control; and the voltage setting circuit is respectively connected to the MCU control circuit and the switching power supply, and configured to output a voltage to the switching power supply to realize a linear adjustment for the output voltage;

wherein the constant current drive circuit is of a current parallel-connection negative feedback structure, wherein a parallel resistor has one terminal connected to an input negative terminal of an operational amplifier and the other terminal connected to an input terminal of a current sampling resistor; one terminal of a current limiting resistor receives an output signal of an analog switch chip, and the other terminal of the current limiting resistor is connected to an input negative terminal of the operational amplifier; a positive terminal of the operational amplifier is connected to an output terminal of a reference voltage chip; and an output signal of the operational amplifier is transmitted to a gate of a power MOSFET.

12. A control method for the voltage-adaptive LED drive circuit according to claim 11, comprising following steps:

step 1, setting, after starting up, an input voltage VFB of a switching power supply to be 0 V, and setting an output voltage Vout of the switching power supply to be a maximum value at this time;

step 2, selecting a maximum output step current Imax of a step current passing through an LED according to a step current value configured by a user, during which cycle an output voltage is controlled;

step 3, acquiring an input voltage VLD+ of the LED, an output voltage VLD− of the LED, and a voltage VRS of a sampling resistor of a constant current drive circuit by a voltage sampling circuit, and calculating an operating voltage VLD at two terminals of the LED;

step 4, calculating a power heat dissipation of an MOSFET in the constant current drive circuit;

step 5, determining a voltage drop VDS across a drain and a source of the MOSFET according to a preset value PH of the power heat dissipation of the MOSFET in the constant current drive circuit;

step 6, calculating an output voltage Vout of the switching power supply;

step 7, calculating a value of an output voltage VT of a DA chip of a voltage setting circuit, and then controlling the output voltage VT of the DA chip of the voltage setting circuit by gradually increasing VT via an MCU control circuit; and step 8, controlling the voltage sampling circuit by the MCU control circuit to sample an operating voltage of each point again, and comparing an actual power consumption of the MOSFET with a preset power consumption to realize a closed-loop control of PID of an output voltage value according to the output voltage Vout of the switching power supply and a value of VT of the DA chip of the voltage setting circuit.

* * * * *